(12) United States Patent
Nielsen et al.

(10) Patent No.: US 6,633,199 B2
(45) Date of Patent: Oct. 14, 2003

(54) AMPLIFIER CIRCUIT, RADIO TRANSMITTER, METHOD AND USE

(75) Inventors: Per Asbeck Nielsen, Copenhagen (DK); Carsten Fallesen, Valby (DK)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/014,404

(22) Filed: Dec. 14, 2001

(65) Prior Publication Data

US 2002/0093378 A1 Jul. 18, 2002

(30) Foreign Application Priority Data

Dec. 15, 2000 (GB) .............................................. 0030693

(51) Int. Cl.$^7$ ................................................ H03G 3/20
(52) U.S. Cl. .................... 330/129; 330/136; 455/126
(58) Field of Search ................ 330/129, 136; 455/126; 332/100, 103

(56) References Cited

U.S. PATENT DOCUMENTS

| | | | |
|---|---|---|---|
| 4,600,892 A | | 7/1986 | Wagner et al. |
| 5,119,042 A | * | 6/1992 | Crampton et al. .......... 330/295 |
| 5,675,288 A | * | 10/1997 | Peyrotte et al. ............. 330/149 |
| 5,742,201 A | * | 4/1998 | Eisenberg et al. ............. 330/2 |
| 6,069,530 A | * | 5/2000 | Clark ........................ 330/149 |

FOREIGN PATENT DOCUMENTS

| | | |
|---|---|---|
| EP | 951143 | 10/1999 |
| GB | 2336484 | 10/1999 |
| GB | 2346492 | 8/2000 |

OTHER PUBLICATIONS

L. Kahn, "Single–Sideband Transmission by Envelope Elimination and Restoration", Proceedings of the I.R.E., 1952, pp. 803–806.
V. Petrovic et al, "Polar–loop Transmitter", Electronics Letters, May 10$^{th}$ 1979, vol. 15, No. 10, pp. 286–288.
European Search Report, dated Jun. 27, 2001.

* cited by examiner

*Primary Examiner*—Henry Choe
(74) *Attorney, Agent, or Firm*—Antonelli, Terry, Stout & Kraus, LLP (57) ABSTRACT

An amplifier circuit for delivering an output signal which varies in amplitude and in phase or frequency, has a power amplifier, an amplitude feedback circuit and a phase or frequency feedback circuit, both constituting closed loops together with said power amplifier, and at least one of said feedback circuits has its gain controllable in dependency of properties of the input or output signals, or both. A radio transmitter includes such an amplifier circuit, and a cellular telephone includes such a radio transmitter. The invention includes a method for controlling an output state in such a radio transmitter.

6 Claims, 3 Drawing Sheets

AMPLIFIER CIRCUIT, RADIO TRANSMITTER, METHOD AND USE

BACKGROUND OF THE INVENTION

The invention relates to an amplifier circuit for delivering a signal which varies in amplitude as well as in phase or frequency, preferably a radio frequency amplifier circuit.

The invention relates as well to a radio transmitter or a cellular telephone comprising an amplifier circuit in their aerial output stage.

Further, the invention relates to a method for controlling a radio frequency output amplifier circuit in a radio transmitter, and to the use of said method in a mobile radio transmitter.

From the article: Leonard R. Kahn: "Single-Sideband Transmission by Envelope Elimination and Restoration", Proceedings of the I.R.E., 1952, pp. 803–806, a Single-Sideband (SSB) Transmitter is known, wherein the phase and amplitude components of an input signal are separated and amplified independently before being mixed in a final output stage.

It is a disadvantage in this transmitter that modulating the amplitude at a high power level tends to generate considerable amounts of spurious signals.

From the article: V. Petrovic & W. Gosling: "Polar-Loop Transmitter", Electronics Letters, $10^{th}$ May 1979 Vol. 15 No. 10, pp. 286–288, a Polar Modulation Feedback Linearisation System for an SSB Transmitter is known, wherein the modulated output from a Radio Frequency Power Amplifier (RF PA) is being controlled by means of two closed loops, each having the same modulated Intermediate Frequency (IF) Signal as the controlling variable. A first loop controls the Amplitude Modulation (AM) or the "envelope" of the RF output signal relative to the IF signal, and a second loop controls the Phase Modulation (PM) of the RF output signal relative to the IF signal. Polar representation of the RF signal vector is used in the article, the vector angle representing the signal phase and the vector magnitude representing the signal amplitude.

It is a disadvantage in systems of the two types mentioned, that the gain of known RF power amplifiers is varying with the power level. This entails poor linearity at high power levels and in the latter system a poor stability of the closed loop. These deficiencies often cause spurious signals or sidebands to be emitted.

The object of the invention is to provide an amplifier circuit for amplifying and delivering signals which are amplitude modulated as well as phase or frequency modulated, the amplifier having improved stability and linearity throughout the entire power level range.

It is a further object of the invention to provide an amplifier circuit of said type with an improved power efficiency.

In particular for transmitter power amplifier circuits used in cellular telephones (mobile phones), stability and linearity are of prime importance in order to utilise efficiently the very limited frequency bands available for this service. Also, a high power efficiency is very important in mobile equipment, in order to obtain a long operating time from a given battery capacity.

SUMMARY OF THE INVENTION

In a first aspect, the invention provides an amplifier circuit for receiving one or more input signals and delivering an output signal which varies in amplitude and in phase and/or frequency, the circuit comprising a power amplifier producing said output signal, a first feedback circuit providing feedback of the amplitude value of said output signal, and wherein said feedback circuit has its gain controllable in dependency of one or more properties of the input signals, the output signal or both, characterised in that the circuit is arranged to differentiate between output power levels to achieve constant gain in the amplitude loop.

Preferably, the circuit is arranged to control the amount of signal feedback to the input of the amplifier according to the output power level.

Preferably, the circuit is arranged to increase the amount of signal feedback to the input of the amplifier at high output power levels, and decrease the amount of signal feedback at low output power levels.

Preferably, the circuit comprises a second feedback circuit providing feedback of the phase or frequency of said output signal, said feedback circuits constituting a closed feedback loop together with said power amplifier.

In one embodiment, the invention provides an amplifier circuit for receiving one or more input signals and delivering an output signal which varies in amplitude and in phase or frequency, the circuit comprising a power amplifier producing said output signal, a first feedback circuit providing feedback of the amplitude value of said output signal, and a second feedback circuit providing feedback of the phase or frequency of said output signal, said feedback circuits constituting closed feedback loops together with said power amplifier, the object mentioned is met in that at least one of said feedback circuits has its gain controllable in dependency of one or more properties of the input signals, the output signal, or both.

Hereby, the phase or frequency linearity as well as the amplitude linearity for the amplifier circuit are substantially improved. This improvement in linearity may advantageously be exploited to achieve better signal qualities such as lower levels of spurious signals, thus enabling e.g. a closer channel spacing or a higher modulation factor without inter-channel cross-talk.

In addition, said improvement may be exploited by the use of power amplifiers having higher power efficiencies, such power amplifiers most often having a marked non-linear behaviour. The use of power amplifiers with higher power efficiencies is generally favourable, but especially so in mobile equipment such as cellular telephones.

It is generally preferred that the output signal is an RF signal. Hereby, the advantages of the amplifier circuit are utilised efficiently in that the amplifier circuit enables a radio transmitter output signal of high quality to be produced, this signal meeting the demands for radio transmissions in to-day's very crowded radio frequency spectrum.

Preferably, the gain of one or more of said controllable gain feedback circuits is controlled by a gain control signal.

Hereby, said gain may be controlled from a sub-system such as e.g. a digital signal processor.

In a preferred embodiment, the first feedback circuit has its gain controllable in dependency of the amplitude of the output signal.

This will enable stabilisation of the amplitude feedback loop gain in the case where the gain of the power amplifier is varying with the output signal amplitude. This is most often the case in power amplifiers with a high power efficiency. In this situation, a substantially constant, high loop gain will be achievable without risk of the varying gain of the power amplifier leading to instabilities in the amplitude loop.

It is preferred that the second feedback circuit constitutes a phase lock loop together with said power amplifier.

This will enable a high phase linearity of the output power amplifier, which will tend to lower any phase distortion arising from imperfections in the power amplifier.

"Cross-talk" from the amplitude modulation to the phase or frequency modulation (or: phase or frequency distortion, respectively, generated by the amplitude modulation) in amplifiers processing compound modulated signals will always be present to some small extent, due to the fact that the shift of the amplifier gain introduced by the shift of the modulated amplitude will in itself affect the momentary phase or frequency, respectively, of the signal.

Substantially cross-talk from the amplitude modulation to the phase or frequency which will normally be encountered when using a power amplifier with a poor amplitude linearity for amplifying signals that are both amplitude and phase or frequency modulated, is however avoided in the embodiments of the invention with both an amplitude feedback loop and a phase locked loop, because the phase distortion generated from the amplitude modulated signal by the amplitude linearity defects of the power amplifier are cancelled by the phase linearity feedback of the phase locked loop.

This is so because the phase distortion is generated inside of the phase locked loop, and thus in a part of the circuit which is controlled by the phase locked loop.

It is particularly preferred that one or more of said input signals are digital signals.

This will enable the amplifier circuit of the invention to be fed with digital modulation information directly from a digital signal processing system, thus simplifying the circuitry of e.g. a radio transmitter comprising the amplifier circuit of the invention.

It is a further object of the invention to provide a radio transmitter having improved amplitude linearity as well as phase or frequency linearity in its aerial output signal.

This object is met by a radio transmitter comprising an amplifier circuit according to the invention in its aerial output stage.

By the radio transmitter comprising an amplifier circuit according to the invention in its aerial output stage, said first feedback circuit providing feedback of the amplitude value of the output signal, and said second feedback circuit providing feedback of the phase or frequency of said output signal, will provide improved amplitude linearity as well as phase or frequency linearity in the aerial output signal from the radio transmitter.

In addition, at least one of said feedback circuits having its gain controllable in dependency of one or more properties of the input signals, the output signal, or both, will enable operation of the amplifier circuit with a constant, high loop gain in the gain controllable loop or loops. This will further improve said linearities.

It is preferred that the radio transmitter comprises a digital signal processing system delivering one or more input signals to said amplifier circuit.

Processing or generating these input signals within a digital signal processing system entails important advantages in that such digital signal processing systems can be large scale integrated, thus reducing cost, weight and power consumption, and in that digital signal processing tends to be more precise and less susceptible to noise.

It is preferred that a digital signal processing system delivers a gain control signal to the amplifier circuit.

Hereby, calculation of a desired gain may readily be made in the digital signal processing system, where adequate computing power is most often already present.

In this connection, it is preferred that the gain control signal is generated by the digital signal processing system from one or more of said input signals.

As these signals are already generated within the digital signal processing system for use as input signals to the amplifier circuit of the invention, derivation of said gain control signal therefrom is advantageously done within said system.

In a particularly preferred embodiment, the digital gain control signal is generated within said digital signal processing system by means of an internal look-up table.

An internal look-up table constitutes an advantageous and efficient means for providing the gain control signal from the input signals in real time processing.

It is a still further object of the invention to provide a cellular telephone having improved amplitude linearity and phase or frequency linearity in its aerial output signal.

In a cellular telephone, this object is met in that the telephone comprises a radio transmitter according to the invention. This entail corresponding advantages as explained above with reference to the radio transmitter.

Another object of the invention is to provide a method for controlling an amplifier circuit of the types mentioned.

In a method for controlling a radio frequency output amplifier circuit in a radio transmitter, said output amplifier circuit receiving one or more input signals and delivering an output signal which varies in amplitude and in phase or frequency, the circuit comprising a power amplifier producing said output signal, the method comprising the steps of:
    feeding back the amplitude of the output signal of the power amplifier via an amplitude feedback path to circuitry comparing the fed back amplitude to a value of at least one of said input signals, thereby providing an amplitude feedback loop around the power amplifier,
    feeding back the phase or frequency of the output signal of the power amplifier via a phase or frequency feedback path to circuitry comparing the fed back phase or frequency to a value of at least one of said input signals, thereby providing a phase or frequency feedback loop around the power amplifier, said object is met in that the method further comprises the step of:
    controlling a gain in at least one of said feedback paths in dependency of one or more properties of the input signal, the output signal, or both, thereby controlling the loop gain in the corresponding feedback loop.

By this measure, the phase or frequency linearity as well as the amplitude linearity for the output amplifier circuit are substantially improved. These improvements in linearity may advantageously be exploited to achieve better signal qualities such as lower levels of spurious signals, thus enabling e.g. a closer channel spacing or a higher modulation factor without inter-channel cross-talk.

In addition, said improvement may be exploited by the use of output power amplifiers with higher power efficiencies, such output power amplifiers most often being very non-linear. The use of power amplifiers with higher power efficiencies is generally favourable, but especially so in mobile equipment such as cellular telephones.

It is generally preferred that one or more of said input signals are digital signals.

This will enable the output amplifier circuit to be fed with digital modulation information directly from a digital signal processing system, thus utilising the inherent advantages associated with digital signal processing in terms of large scale integration of circuits and flexibility in programming such systems, and in terms of more favourable precision and noise characteristics.

In a preferred embodiment, the gain of said amplitude feedback path is controlled in dependency of the amplitude of said output signal.

In this way, an important control of the resulting loop gain is attained, rendering it possible to keep a continuously high loop gain and thereby a high amplitude linearity by counteracting variations in the amplitude gain of the output power amplifier.

In a further preferred embodiment, the gain of said amplitude feedback path is controlled as a predetermined function of the amplitude of said output signal, and said function is determined to counteract variations in the gain of said power amplifier with the amplitude of said output signal, whereby a loop gain of substantially constant value is obtained in the amplitude feedback loop despite said variations.

When variations in the amplitude gain of the output power amplifier with the amplitude of the output signal are known, the gain in the amplitude feedback may according to the invention be controlled to obtain a continuously high loop gain.

In a particularly preferred embodiment, a digital representation of said function is stored in a digital memory, preferable a look-up table in a digital signal processing system.

Hereby, an advantageous, fast and cost efficient read-out of the function is had, resulting in fast and simple control of the loop gain.

Finally, it is an object of the invention to provide a mobile radio transmitter such as a cellular telephone having improved amplitude linearity and phase or frequency linearity in its aerial output signal.

According to the invention, this object is met by the use of the method according to the invention in a mobile radio transmitter, preferably a mobile radio transmitter in a cellular telephone.

Said use entails advantages corresponding to those mentioned above with respect to the method of the invention. Said advantages are particularly relevant in the case of mobile radio transmitters as they permit reductions in size, weight, cost and power consumption of said transmitters. In the case of cellular telephones, said cost reductions are important owing to the heavy competition in the market for cellular telephones.

BRIEF DESCRIPTION OF THE DRAWINGS

Below, the invention will be explained in more detail by means of embodiment examples and with reference to the drawings, in which corresponding reference designations refer to same or corresponding items, reference letters generally refer to signals and reference numerals generally refer to elements, and in which.

DETAILED DESCRIPTION OF THE INVENTION

Figure 1:
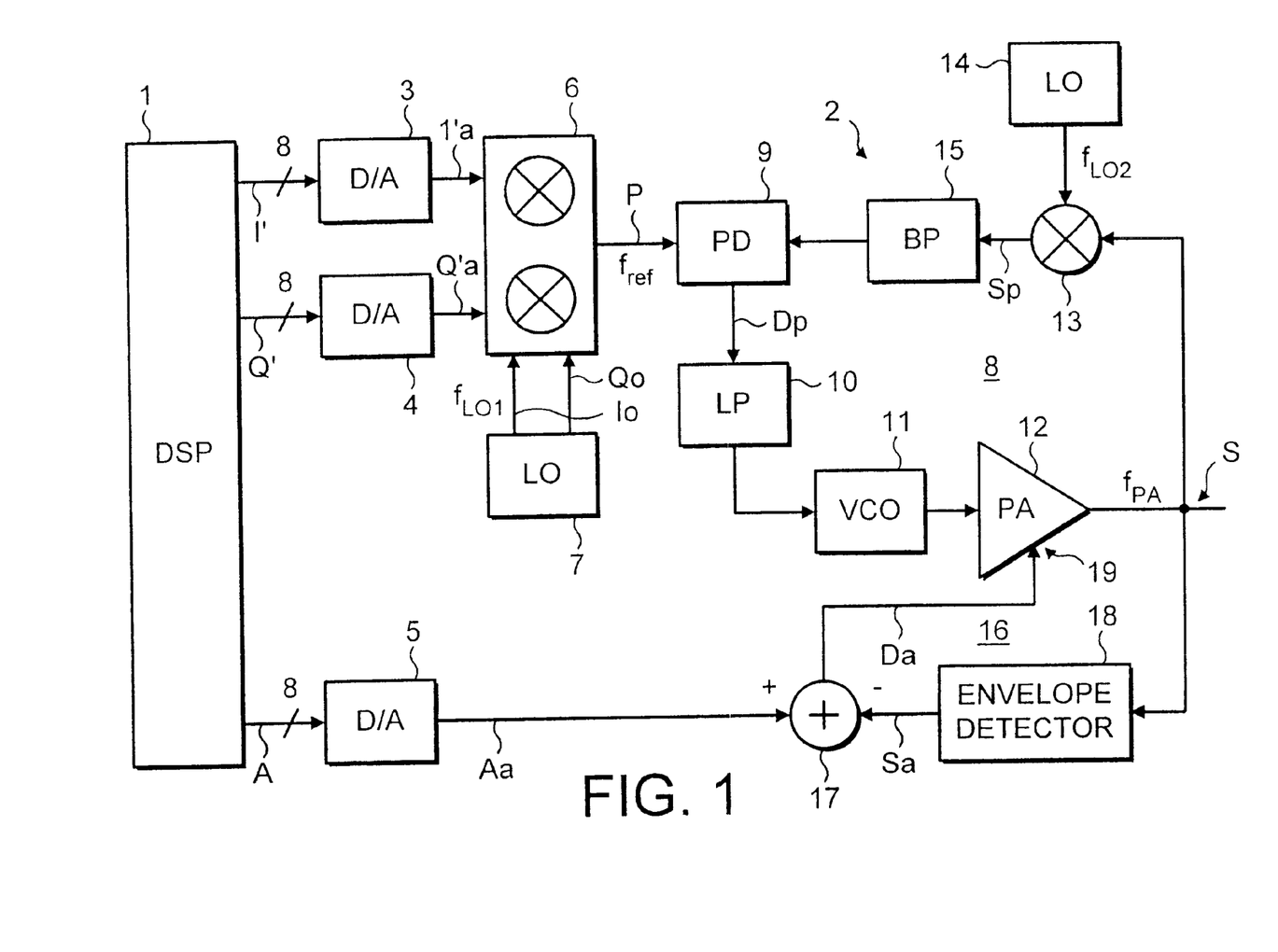
FIG. 1 schematically shows part of the circuitry in a radio transmitter according to the invention.

In FIG. 1, a digital signal processor 1 produces digital signals I', Q', A containing modulation information. The digital signal processor communicates in a way not shown with other circuitry in the radio transmitter, such as signal providing circuitry.

In the embodiment shown, the digital signals I', Q', A are used for controlling an analog output stage 2. The analog output stage 2 produces an output signal S which is fed to an aerial.

According to one embodiment of the invention, the digital signals I' and Q' represent the Cartesian co-ordinates of a unit phase vector of the desired output signal S. In the embodiment shown, this is accomplished by the signal I' having a value proportional to cos $\phi(t)$ and the signal Q' having a value proportional to sin $\phi(t)$, $\phi(t)$ being the momentary value of a desired phase shift of the phase modulated output signal S.

In this way, the value of $\phi(t)$ designates the momentary phase value which is to be added to the phase of the carrier wave of the output signal S, in order to obtain the desired phase modulation of this signal. It is evident that the phase shift representation provided by the I' and Q' signals constitutes unambiguous information on the desired phase modulation of the output signal S, as long as the phase shift is kept within the interval of $-180°<\phi(t)<180°$.

Phase and/or frequency modulation schemes are known for providing unambiguous phase information beyond the limits of this interval.

In the embodiment shown, the digital signal A represents the amplitude value of the output signal S.

Thus, the complete output signal S may be expressed as $S(t)=A(t)(Re[(I'(t)+jQ'(t))e^{j\omega_c t}])$; j being the imaginary unit, and $\omega_c$ being the angular frequency? of the carrier wave.

The digital signals I', Q', A are preferably represented as n-bit words with the bits transmitted in parallel. In FIG. 1, said digital signals are represented as each their 8-bit word, transmitted on 8-wire lines. This does not, however, implicate that 8-bit words are required or preferred in any specific application. For example, words of 8 to 12 bits might be preferred for use in e.g. cellular telephone equipment.

Each 8-wire line in FIG. 1 runs to a digital-to-analog converter 3–5, where the respective digital signals are converted to analog voltage signals I'a, Q'a, Aa.

The two analog voltage signals I'a, Q'a are carried to a quadrature mixer 6 where these two signals are mixed with two signals Io, Qo from a local oscillator 7, operating at a frequency $f_{LO1}$. The two signals Io, Qo are in quadrature, i.e. phase shifted 90° respective to one another.

Such local oscillator signals may be generated easily with adequate precision, e.g. by frequency dividing a master oscillator square wave signal into two quadrature square wave signals, or by generating by means of a CR coupling and an RC coupling (resistance-capacitance couplings) a +45° and a −45° phase shifted sine wave from a master sine wave.

The output from the quadrature mixer 6 is a single analog phase signal P, having a fixed carrier frequency $f_{ref}$ and being phase modulated with a phase shift corresponding to the phase of the virtual phase vector (I',Q').

In any case, the signal P is a constant magnitude signal (preferably a constant voltage signal) and thus free from any amplitude information and amplitude noise. The signal P may preferably be amplitude limited so as to ensure a constant magnitude, and reduce any possible amplitude noise.

The analog phase signal P is now used as reference input to a phase locked loop 8. The elements of this loop comprise:

a phase detector 9;

a low-pass filter 10;

a voltage controlled oscillator 11;

a power amplifier 12;

a feedback (or: down-conversion) mixer 13;

a local oscillator 14; and a band-pass filter 15.

The functioning of the phase locked loop 8 is preferably as follows: The output signal S having the frequency $f_{PA}$ is carried to a mixer 13 where it is mixed with a local oscillator signal of frequency $f_{LO2}$ from a local oscillator 14, in order to obtain a signal Sp having the phase shift or offset of the output signal S, but at the frequency of the analog phase signal P. The signal Sp and the analog phase signal P are led to a phase detector 9, detecting the phase difference between the signals P and Sp. A low-pass filter or preferably a band pass filter 15 is coupled between the mixer 13 and the phase detector 9.

A phase difference signal Dp is carried via a low-pass filter 10 to a voltage controlled oscillator 11. This oscillator oscillates at a centre frequency corresponding to the centre frequency of the desired output signal, and its output signal is used as input signal to a power amplifier 12 providing the desired output signal S.

Thus, the voltage controlled oscillator 11 acts as a frequency converter circuit in that it provides the desired phase information (contained in the phase signal P) at a desired carrier frequency (i.e., the centre frequency of the voltage controlled oscillator 11).

The phase locked loop 8 is now closed, in that the signal S is carried to the mixer 13 as previously mentioned.

As the actual frequency of the voltage controlled oscillator 11 and hence the power amplifier 12 is now controllable by the phase difference signal Dp carried to the voltage controlled oscillator 11 via the low-pass filter 10, any phase difference between the analog phase signal P and the output signal S is minimised by the feedback in the phase locked loop 8.

Thus, the phase of the output signal S is the same as the phase of the analog phase signal P.

In another embodiment (not shown) of the phase loop of the invention, the feedback mixer 13, the local oscillator 14 and the band-pass filter 15 are replaced by a divider circuit, dividing down the output signal S from the frequency $f_{PA}$ to the frequency $f_{ref}$ of the quadrature mixer 6 and the phase detector 9. This will complete and close the phase lock loop as well, but the resulting phase shift of the output signal S will be multiplied by the factor $f_{PA}/f_{ref}$ as compared to the signal P.

In this embodiment, therefore, the phase shift defined by the digital signals 1', Q' must be reduced by the factor $f_{PA}/f_{ref}$ as compared to the desired phase shift of the output signal S.

Returning to FIG. 1, the analog voltage signal Aa is used as reference input to an amplitude feedback loop 16. The elements of this loop comprise:

an analog difference element 17;

the power amplifier 12, provided with a gain control input 19; and an amplitude detector (or AM demodulator) 18.

The functioning of the amplitude feedback loop 16 is preferably as follows:

The output signal S is led to the amplitude detector 18. The output signal Sa from said detector 18 is now corresponding to the momentary amplitude of the output signal S.

The analog amplitude signal Aa and the detected amplitude Sa is compared in the analog difference element 17, and the difference Da is carried to the gain control input 19 of the power amplifier 12.

The amplitude feedback loop 16 is now closed, in that the signal S is carried to the amplitude detector 18 as mentioned above.

As the actual amplitude of the output signal S is now controllable by the amplitude difference signal Da, any amplitude disproportionality between the analog amplitude signal Aa and the output signal S is minimised by the feedback in the amplitude feedback loop 16.

Thus, the amplitude of the output signal S is controlled to be proportional to the amplitude of the analog amplitude signal Aa. In this way, the amplitude feedback loop 16 acts as an amplitude control loop or an amplitude modulating circuit, providing a desired modulated amplitude of the output signal S.

The output signal S is carried to an aerial by means not shown; these may include antenna tuning components or circuits.

By the measures thus explained, the use of comparatively simple analog modulator circuits is made possible, partly owing to a greater part of the processing of the modulating signals being carried out in the digital domain, preferably in the digital signal processor 1.

Further, phase and amplitude modulation information are kept entirely separate within the analog domain, except for the power amplifier 12, thus minimising cross-talk between the phase and amplitude modulation from the digital signal processor 1 to the power amplifier 12.

By the very principle of having two feedback loops closed around the power amplifier 12, that is, the phase locked loop 8 and the amplitude feedback loop 16, amplitude distortion of the signals in the phase loop will not affect the output signal S significantly, and the phase variations of the output signal S will not affect the functioning of the amplitude feedback loop 16.

The provision of the digital signals 1', Q', A containing the phase and amplitude modulation information from an existing digital signal processing system is still simple, being mostly dependent on appropriate software.

An important advantage of the set of said three digital signals according to the invention is that the signals will be more linear and less noisy than corresponding analog signals would be, owing to the greater precision and less noise susceptibility of the circuits of the digital signal processor as compared to analog circuitry. Further, the kind of signal processing involved is handled more power efficient and more precise by the digital signal processor than by analog circuits.

If the necessary modulation information is available in the digital signal processor in the form of an I signal and a Q signal, that is, signals representing an actual phase-and-amplitude vector of the output signal S, the following transformation or calculations will provide the I'and the Q'signals of the present invention:

I and Q are the complex coordinates of a vector, whose angle with the real axis represents the desired phase shift and whose magnitude represents the desired amplitude of the output signal. Thus, $I(t)=A(t)\cos \phi(t)$ and $Q(t)=A(t)\sin \phi(t)$; $A(t)$ being the momentary amplitude and $\phi(t)$ being the momentary value of a desired phase shift of the phase modulated output signal S.

From these signals I(t) and Q(t), the signal set of the invention may now be obtained by the following calculations:

$$A(t)=(I(t)^2+Q(t)^2)^{-\frac{1}{2}}$$

$$I'(t)=I(t)/A(t)$$

$$Q'(t)=Q(t)/A(t)$$

These calculations are easily and efficiently performed by a digital signal processor of the state of the art, and will not occupy significant amounts of its signal processing power.

The power amplifier 12 having the gain control input 19 need not be provided as a one-stage amplifier, as it is indicated in FIG. 1.

Figure 2:
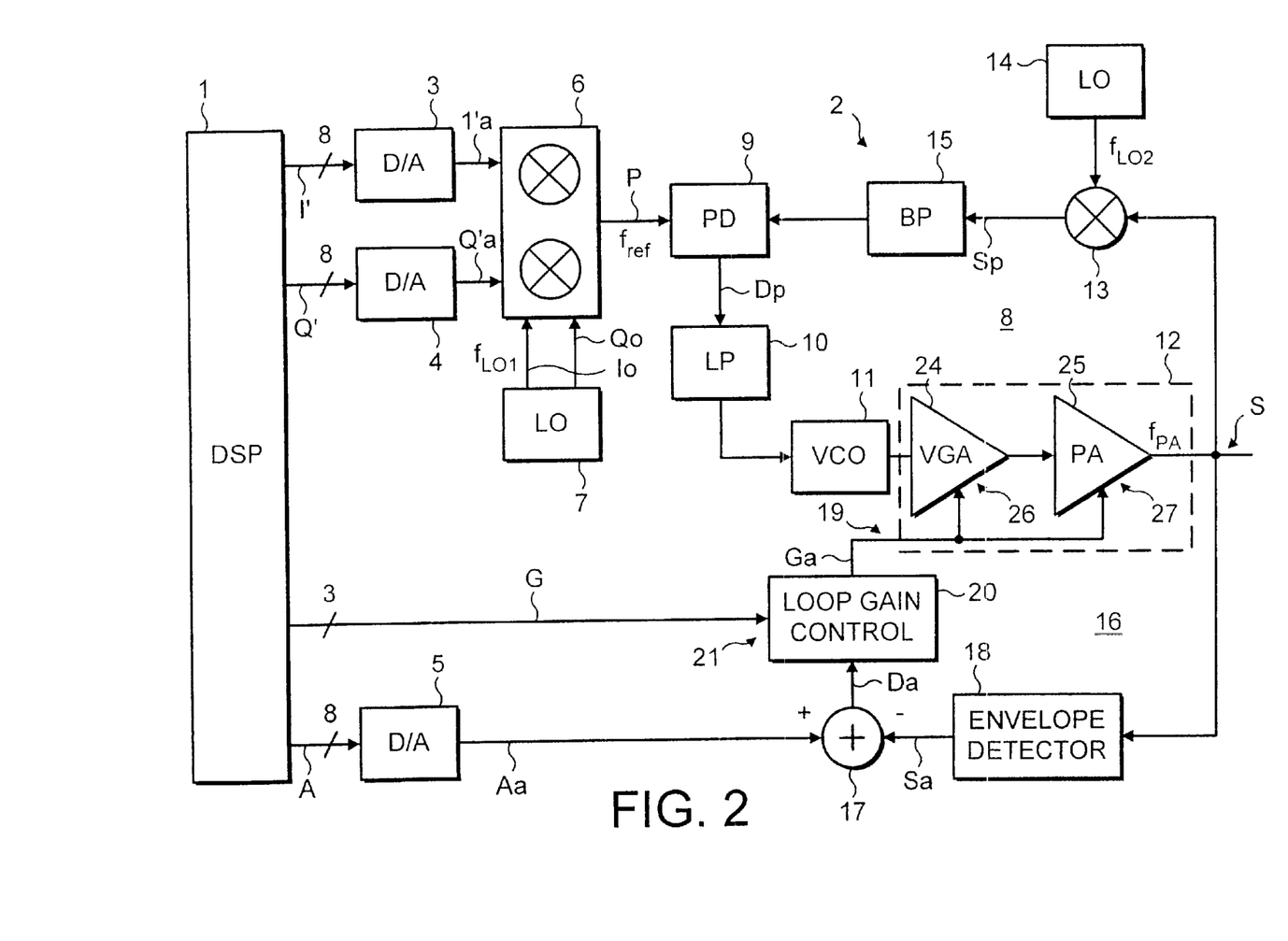
FIG. 2 schematically shows the circuitry in FIG. 1, with a variable gain amplifier in the amplitude feedback loop, and a power amplifier comprising a variable gain amplifier.

FIG. 2 shows a preferred embodiment of the circuit in FIG. 1. In FIG. 2, the power amplifier 12 is provided as a two-stage circuit comprising a variable gain amplifier 24 acting as a pre-amplifier as well as a regular power amplifier 25. According to the invention, both these amplifiers 24–25 are preferably equipped with gain control inputs 26 and 27, respectively, as shown in FIG. 2.

In this way, the utilised gain range per stage might be made narrower, permitting use of simpler amplifiers 24–25 with narrower gain ranges. For example, in certain power amplifier stages 25 having otherwise desirable characteristics, the gain tend to drop to near zero for very small or very large signal amplitudes.

It would require rather much from the amplitude feedback loop 16 to compensate for such high variations in the gain of the power amplifier 12. By dividing the power amplifier 12 into two amplifier stages 24–25 as shown in FIG. 2, each of these stages need only be controlled through a gain range of, in principle, the square root of the desired, total gain range of the whole power amplifier 12. Dividing the power amplifier 12 in more than two stages will of course be within the scope of the present invention as well.

In FIG. 2, the gain of the amplitude feedback loop 16 is made controllable by inserting a loop amplifier 20 in the feedback path of the amplitude feedback loop 16.

The amplitude linearity of the power amplifier (from the analog amplitude signal Aa to the output signal amplitude S) and the stability of the amplitude feedback loop 16 are dependent on the loop gain of this loop. The higher the loop gain in the amplitude feedback loop, the better the amplitude linearity and the poorer the loop stability.

In general, the loop gain has to be kept below a certain fraction of that loop gain which causes instability in the loop. The difference between said fraction and the loop gain value causing instability is often referred to as the stability margin. In order to obtain "clean" and well controlled output signals, the stability margin has to be kept above a certain value.

Now, according to the invention, the gain of the loop amplifier 20 is controlled in dependency of the amplitude of the output signal S so as to obtain a loop gain in the amplitude feedback loop 16 of substantially constant value.

Preferably, the loop amplifier 20 has its gain controllable by means of a gain control signal G which is present on a gain control input 21 of said amplifier 20.

The loop amplifier 20 now amplifies the amplitude difference signal Da by a factor corresponding to the gain control signal G, into a power amplifier gain control signal Ga to be coupled to the gain control input 19 of the power amplifier 12.

When the gain characteristics of the power amplifier 12 and of the loop amplifier 20 are known, it will be possible to determine for each level of the desired amplitude of the output signal S, a value of the gain control signal G which will render the loop gain substantially constant at a desired level.

This however defines a relationship between the desired amplitude of the output signal S and a corresponding value of the gain control signal G. Thus, this relationship may according to the invention be implemented within the digital signal processor 1 so that said processor supplies a gain control signal G which is constantly adjusted to obtain a loop gain of substantially constant value as well as a satisfactory stability margin, even if the value of the output signal amplitude and hence the gain of the power amplifier 12 is varying considerably.

In the embodiment in FIG. 2, the gain control signal is by way of example provided by the digital signal processor 1 in the form of an 8-bit word.

Technically simple, power efficient and economically profitable power amplifiers of the state of the art often have amplitude gains which are varying highly with the amplitude level of the amplifier output, and amplitude modulated output signals of high quality from such amplifiers will not be obtainable without appropriate countermeasures.

On the other hand, the prospective savings in cost as well as power consumption using such amplifiers might be considerable.

By the measures of the invention thus described, the amplitude linearity of the power amplifier 12 is controlled efficiently by the amplitude feedback loop 16. This will permit use of a power amplifier of quite poor amplitude linearity, provided it has a possibility of real-time gain control.

In practice, experiments and modelling have proved that power amplifiers 12 of quite poor amplitude linearity might be used in the circuit of FIG. 2, with very satisfactory results indeed.

Further, experiments have indicated that the accuracy of the loop gain value need not be very high. Thus, according to the invention, the relationship between the desired amplitude of the output signal S and a corresponding value of the gain control signal G may be implemented in the form of an internal lookup table in the digital signal processor, and in order to save memory space, the look-up table may be quantified in that for a certain value interval of the independent variable (here: the desired amplitude of the output signal S), one and only one value of the dependent variable (here: the value of the gain control signal G) is put out from the table.

In addition, to further simplify matters, according to the invention, the contents of said look-up table may be determined from measurements on one or few sample power amplifiers of the type to be used in the application in question. Experiments have shown that the deviations as to amplitude linearity characteristics from sample to sample of power amplifiers tend to be negligible in the present context.

Figure 3:
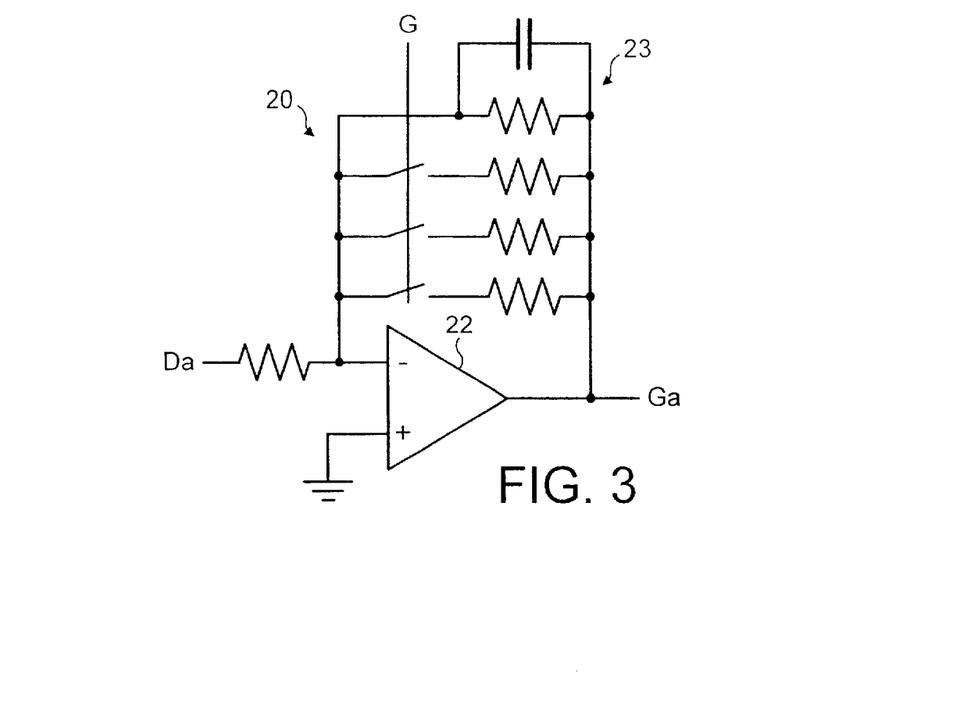
FIG. 3 schematically shows a variable gain amplifier for use in the circuitry in FIG. 2.

In FIG. 3, a simple and advantageous implementation of an inverting, controllable gain amplifier suitable for use as the loop amplifier 20, is shown. For the sake of simplicity, it is assumed in FIG. 3 that the gain control signal G is a 3-bit word. Each of the three bits control one of the three switches shown, which engage each their feedback resistor of an inverting amplifier 22. By closing appropriate switches, a desired resulting resistance value of the feedback resistor network 23 and hence a desired gain of the amplifier 20 is obtained.

In fact, the loop amplifier 20 in FIG. 3 has a digital control input which in the embodiment shown will receive a digital signal in the form of a 3-bit word G(t) as its control signal. This digital signal might preferably be supplied directly by the digital signal processor 1, as indicated in FIG. 2.

As an alternative (not shown) to the digitally controllable gain amplifier in FIG. 3, an analog multiplier (or: Gilbert-mixer) may be utilised for the loop amplifier 20. Such a multiplier will have its analog output voltage proportional to the product of the values of its two analog input voltages. Then, the resulting gain from a first input to the output will be proportional to the analog voltage on a second input.

This alternative, of course, will necessitate a digital-to-analog conversion of the gain control signal G into an analog signal to be coupled to said second input of the analog multiplier. The amplitude difference signal Da is then coupled to said first input, and the power amplifier gain control signal Ga taken from said output of the analog multiplier.

Figure 4:
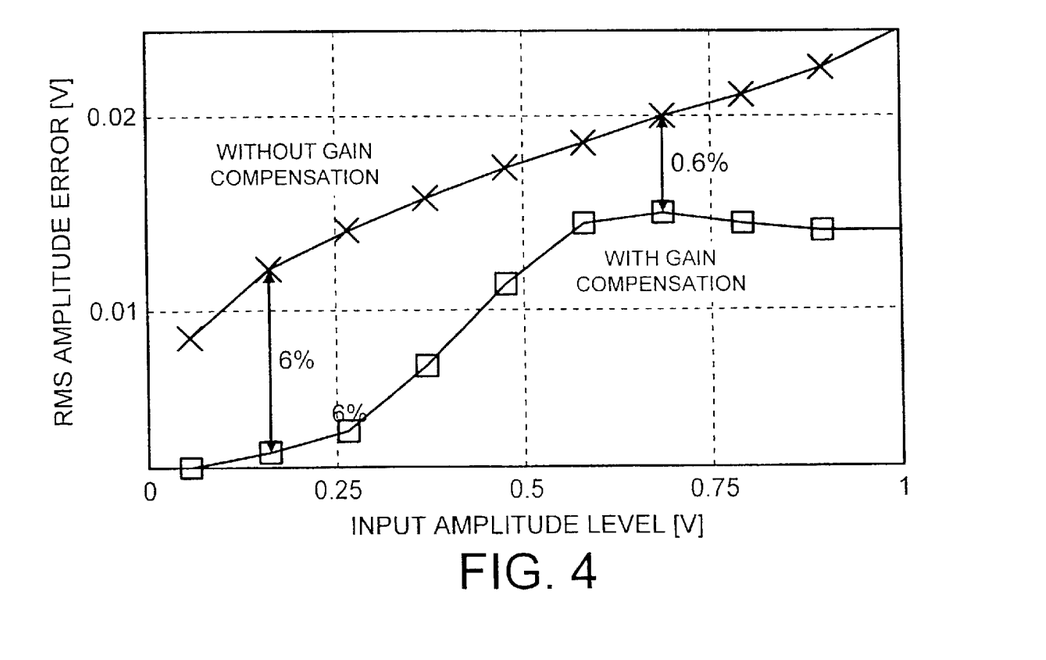
FIG. 4 is a graph showing the RMS voltage error of the output signal from the circuit of FIG. 1 plotted as a function of the input amplitude level, with and without amplitude feedback loop gain control.

In FIG. 4, results from a model simulation of a power amplifier 12 in an amplifier according to the invention are plotted in a graph. In the simulation in question, an amplitude feedback loop 16 was simulated, with its loop gain controlled by means of a loop amplifier 20, and without such loop gain control, respectively.

In the simulation, the gain characteristic of the power amplifier 12 was chosen so that the gain was set to approach zero for very small and for very large signal amplitudes, due i.a. to compression and turn-off phenomena. This will correspond to the conditions when using one of several common types of simple and power efficient power amplifiers 12.

The value of the gain control signal G was quantified to 4 bits, giving a minimum value of 1 and a maximum value of 5. The maximum DC loop gain was 20.

A test signal of a certain duration, amplitude as well as phase modulated, was defined in the form of a time-dependent (I,Q)-vector. This signal was split into a time-dependent (I',Q'A)-signal, and applied to said simulated circuit. Nine simulations were made, with the test signal at nine different amplitude maximum levels.

The RMS amplitude error voltages as functions of the test signal amplitude level is shown in the graph in FIG. 4. In FIG. 4, the abscissa is the relative maximum amplitude level of the test signals, and the ordinate is the corresponding RMS amplitude errors.

The curve "x" shows the RMS amplitude error without loop gain control, and the curve "□" shows the RMS amplitude error with loop gain control ("Gain Compensation") in the amplitude loop.

At two amplitude levels, the difference between the RMS error voltages without and with gain control respectively, is indicated. At approximately 0.15 V maximum input amplitude level, this difference amounts to 6% of the maximum input amplitude level, and at approximately 0.70 V maximum input amplitude level, the difference amounts to 0.6% of the maximum input amplitude level.

A considerable improvement is thus observed for all maximum amplitude levels, even though both systems have the same maximum loop gain and stability margin. For low amplitudes, said improvement of more than 6% RMS is observed.

The aspects and the embodiments of the invention have been explained above in general terms to illustrate the general utility of the invention in areas where accurate analog power amplification of digitally processed signals is needed.

However, the use of the invention in the area of cellular telephony will be particularly advantageous, in particular for the following reasons.

In mobile telephony, the need for information throughput is steadily increasing. The use of combined amplitude and phase modulation will enable a higher information transfer per channel as compared to systems with only phase modulation such as e.g. the original GSM system. Such higher data rates are needed in coming generations of cellular telephony, as well as in planned extensions of the GSM system.

The present invention will provide systems, methods, circuits and uses which will enable a higher information data rates in cellular telephone channels.

As cellular telephones are highly price sensitive products due to the heavy competition on the market, it is essential that the electronic circuits in the telephones be manufactured as cost effectively as possible. This requires a low component count and few analog circuits which might require trimming or adjustment. These objectives are met by the invention, as has been explained above.

Also, power consumption of a cellular telephone is a specific competition parameter, because low power consumption will reduce battery weight and/or increase service time of the telephone. The invention contributes to a low power consumption of a cellular telephone.

These facts make the use of the different aspects of the invention explained above very advantageous in cellular telephones as well as in other mobile radio transmitter equipment.

Even if reference is made above merely to phase modulation and to a phase locked loop, nothing will prevent the method, the digital signal set, the radio transmitter or the uses according to the invention to be utilised with use of frequency modulation instead of phase modulation, and a frequency linearising feedback loop instead of a phase locked loop.

What is claimed is:

1. A radio transmitter comprising:
    an amplifier circuit for receiving one or more input signals and delivering an output signal which varies in amplitude and in phase and/or frequency,
    wherein said amplifier circuit comprises:
        a power amplifier producing said output signal, and
        a feedback circuit providing feedback of the amplitude value of said output signal,
        wherein said feedback circuit has its loop gain controllable in dependency of one or more properties of the input signals, the output signal or both,
        wherein said amplifier circuit is arranged to differentiate between output power levels to achieve constant loop gain in said feedback circuit, and
        wherein said amplifier circuit is included in an aerial output stage of said radio transmitter; and
    a digital signal processing system delivering one or more input signals to said amplifier circuit.

2. A radio transmitter according to claim 1, wherein said a digital signal processing system delivers a gain control signal to said amplifier circuit.

3. A radio transmitter according to claim 1, wherein said digital signal processing system delivers a gain control signal to said amplifier circuit, and
    wherein said gain control signal is generated by said digital signal processing system from one or more of said input signals.

4. A radio transmitter according to claim 1, wherein said digital signal processing system delivers a gain control signal to said amplifier circuit, and wherein said digital gain control signal is generated within said digital signal processing system by use of an internal look-up table.

5. A cellular telephone comprising a radio transmitter having an amplifier circuit according to claim 1.

6. A method for controlling a radio frequency output amplifier circuit in a radio transmitter, said output amplifier circuit receiving one or more input signals and delivering an output signal which varies in amplitude and in phase and/or frequency, the circuit comprising a power amplifier producing said output signal, the method comprising the steps of:

feeding back the amplitude of the output signal of the power amplifier via an amplitude feedback path to circuitry comparing the fed back amplitude to a value of at least one of said input signals, thereby providing an amplitude feedback loop around the power amplifier;

controlling a loop gain in the amplitude feedback path in dependency of one or more properties of the input signal, the output signal, or both, thereby controlling the loop gain in the amplitude feedback path and differentiating between output power levels to achieve maximized gain in the amplitude feedback loop, wherein the loop gain of said amplitude feedback path is controlled in dependency of the amplitude of said output signal, wherein the loop gain of the amplitude feedback path is controlled as a pre-determined function of the amplitude of said output signal, wherein said predetermined function is determined to counteract variations in the gain of said power amplifier with the amplitude of said output signal, whereby a loop gain of substantially constant value is obtained in the amplitude feedback path despite said variations, and wherein a digital representation of said predetermined function is stored in a digital memory, preferable a look-up table in a digital signal processing system.

* * * * *